United States Patent
Simoens

(10) Patent No.: US 9,288,099 B2
(45) Date of Patent: Mar. 15, 2016

(54) PREDISTORTION CIRCUIT AND METHOD FOR PREDISTORTING A SIGNAL

(71) Applicant: NEWTEC CY, Sint-Niklaas (BE)

(72) Inventor: Frederik Simoens, Balegem (BE)

(73) Assignee: NEWTEC CY, Sint-Niklaas (BE)

( * ) Notice: Subject to any disclaimer, the term of this patent is extended or adjusted under 35 U.S.C. 154(b) by 0 days.

(21) Appl. No.: 14/766,821

(22) PCT Filed: Jan. 31, 2014

(86) PCT No.: PCT/EP2014/051947
§ 371 (c)(1),
(2) Date: Aug. 10, 2015

(87) PCT Pub. No.: WO2014/122080
PCT Pub. Date: Aug. 14, 2014

(65) Prior Publication Data
US 2016/0006597 A1     Jan. 7, 2016

(30) Foreign Application Priority Data
Feb. 11, 2013 (GB) .................................. 1302359.3

(51) Int. Cl.
*H04K 1/02* (2006.01)
*H04L 27/36* (2006.01)
*H04B 1/04* (2006.01)

(52) U.S. Cl.
CPC ............ *H04L 27/367* (2013.01); *H04B 1/0475* (2013.01)

(58) Field of Classification Search
CPC ...................... H04L 25/03343; H04L 27/2601; H04L 27/00; H04L 27/36; H04L 27/366; H04L 27/0008; H04L 27/367; H04L 2025/03394; H04L 2025/03401; H04L 27/2697; H04L 27/34; H04B 1/0475; H04B 1/10; H04B 1/04; H04B 2001/0425; H04B 1/62; H03F 1/34; H03F 1/3211; H03F 2201/3221; H03F 1/3247; H03F 1/3252; H03F 1/3217

USPC .......................... 375/260, 296, 261, 279, 297; 455/114.3; 332/103
See application file for complete search history.

(56) References Cited

U.S. PATENT DOCUMENTS 7,123,663 B2    10/2006   De Gaudenzi et al.
2002/0164949 A1  11/2002  Beech et al.
(Continued)

FOREIGN PATENT DOCUMENTS

| | | |
|---|---|---|
| EP | 0951769 A1 | 10/1999 |
| EP | 1129556 B1 | 8/2007 |
| WO | 02073920 A1 | 9/2002 |

OTHER PUBLICATIONS

Great Britain Search Report for corresponding Great Britain Application No. GB1302359.3, Jul. 31, 2013.
(Continued)

*Primary Examiner* — Rahel Guarino
(74) *Attorney, Agent, or Firm* — Workman Nydegger

(57) ABSTRACT

A predistortion circuit for countering interference affecting a digital signal during transmission over a transmission link comprises a path of the digital signal between a mapper at a transmitter side and a demapper at a receiver side. The predistortion circuit is arranged for receiving a version of a digital symbol selected from a predefined constellation used for mapping a bit stream, and includes at least one correction stage provided with a correction path arranged for determining a correction term as a function of the output of a model equivalent to the transmission link and a corresponding symbol of a target constellation. The position of the target constellation points is determined using a measure accounting for the transmission link. The predistortion circuit is arranged for adding the correction term to the received version of the digital symbol and outputting the result of adding as an updated version of the digital symbol.

17 Claims, 8 Drawing Sheets

(56) References Cited

U.S. PATENT DOCUMENTS

2005/0258898 A1    11/2005  Hongo
2011/0103507 A1*  5/2011  Beidas ................ H04L 27/0008
                                                                  375/285

OTHER PUBLICATIONS

International Search Report for corresponding International PCT Application No. PCT/EP2014/051947, Apr. 24, 2014.

* cited by examiner

-- PRIOR ART --

-- PRIOR ART --

PREDISTORTION CIRCUIT AND METHOD FOR PREDISTORTING A SIGNAL

FIELD OF THE INVENTION

The present invention is generally related to the field of techniques for reducing signal distortion in a digital communication system. More in particular, it relates to techniques for predistorting a modulated signal.

BACKGROUND OF THE INVENTION

The present invention relates to the predistortion of a modulated signal prior to its transmission over a wired or wireless channel, with the purpose of reducing the distortion incurred by the signal from the channel. An example of such a channel is a satellite communication channel, whereby optimal satellite resources usage requires transmitting a signal which uses the satellite amplifier at or close to its saturation point and which exhibits a high bandwidth relative to the bandwidth of the circuitry present in the satellite and ground infrastructure. Under these circumstances, the transmitted signal typically incurs distortion, reducing the reliability of the communication.

The transmitter output in a digital communication system, particularly a satellite communication system, can be seen as a sequence of modulated complex symbols. Each symbol is selected from an allowed set of complex values, represented by an in-phase and quadrature component (I and Q). The set of possible symbols is called a constellation. Several modulation strategies can be envisaged in satellite communications, including quadrature amplitude modulation (QAM), phase shift keying (PSK) and amplitude and phase shift keying (APSK). These modulation strategies employ different type of constellations. For example, in the APSK modulation scheme the constellation points are located on two or more concentric rings.

In FIG. 1 a satellite communication link with its main components is shown as an example of a transmission link. In this example structure, the transmit symbols are upsampled, fed to a transmit filter, modulated onto a carrier wave and upconverted to a frequency suitable for signal transmission to the satellite. The signal is received by the satellite's transponder, which operation is illustrated in the simplified schematic drawing of FIG. 2. The transponder's incoming signal is passed to a bandpass input multiplexer filter (IMUX), amplified by a travelling wave tube amplifier (TWTA), and filtered again by a bandpass output multiplexer filter (OMUX). The transponder output signal travels to a plurality of receivers. One such receiver will downconvert the signal to a frequency convenient for demodulation, demodulate the signal and filter it with a receive filter. Finally, it will sample the signal to extract the received symbols. A transmission link, like the example shown in FIG. 2, can be represented by an equivalent symbol-input/symbol-output model.

In the absence of channel distortion, the output symbols of the transmission link or its equivalent model are equal to the input symbols. On a transmission link of practical use, distortion changes the average location of the received constellation symbols. This kind of distortion is typically caused by channel non-linearities which change the phase and amplitude of the transmitted signal as it passes through the channel. Channel distortion, be it linear or non-linear, also causes adjacent symbols to interfere with each other. This type of interference is known as inter-symbol interference (ISI).

Several prior art predistortion techniques exist that introduce a compensation in the transmitter for the distortion caused by the channel. One of these techniques, disclosed e.g. in WO02/73920, applies successive interference cancellation (SIC). SIC aims at subtracting from the transmitted symbols the interference expected at the receive side. It comprises several identical stages, which successively generate an approximation of the required predistortion in order to compensate for the remaining receiver distortion. This reduces the inter-symbol interference (ISI) and partially corrects the location of the received constellation symbols.

In patent application US2002/164949 a satellite communication apparatus is disclosed comprising a corrector for reducing distortion of a signal in a communication channel. The corrector is formed by a forward model representative of a pre-calculated estimate of non-linearity and group delay of the satellite transmission/reception channel from the input to the up-sampler through to the output of the down-sampler. The forward model may also comprise a model of magnitude response of a satellite input multiplexer filter and output multiplexer filter. Cascaded identical stages of the corrector may be provided so that distortion in the channel is successively reduced towards zero by each successive stage.

However, various problems exist with the prior art solutions. The first problem is that the distortion on the constellation points with a large magnitude is not perfectly corrected. This is because the non-linearity limits the correction applicable close to the saturation point. For APSK constellations, for example, the impacted constellation points are located on the outer ring. A second problem is that the constellation points with large magnitude are biased towards the constellation origin. As a result the average points (or mass points) of each received constellation point do not coincide with the transmitted constellation. A consequence of this problem is that the mass points of the received constellation deviate from the original constellation and therefore the original constellation no longer delivers the performance it was expected to deliver. Another consequence is that a receiver unaware of the channel distortion expects the average points of the received constellation at their original location. As a result, the reliability and performance of the communication system is reduced.

Hence, there is a need for a solution where the above-mentioned problems are avoided or overcome.

SUMMARY OF THE INVENTION

It is an object of embodiments of the present invention to provide for predistortion circuit and method with improved performance.

The above objective is accomplished by the solution according to the present invention.

In a first aspect the invention relates to a predistortion circuit for countering interference affecting a digital signal during transmission over a transmission link comprising a path of the digital signal between a mapper at a transmitter side and a demapper at a receiver side. The predistortion circuit receives at its input a version of a digital symbol, selected from a predefined constellation used for mapping a bit stream. The predistortion circuit comprises at least one correction stage provided with a correction path arranged for determining a correction term being a function of the output of a model equivalent to said transmission link and a corresponding symbol of a target constellation wherein the position of the constellation points is determined using a measure accounting for said transmission link. The predistortion circuit is further arranged for adding the correction term to said version of the digital symbol received at the input of the predistortion circuit and for outputting the result of said adding as an updated version of the digital symbol.

As opposed to the prior art solutions the predistortion approach according to this invention exploits a so-called target constellation to take symbols from and proposes to use symbols in the target constellation for determining an updated version of the digital symbol being processed. Doing so yields a substantial performance gain, as detailed later in this description. More precisely, the predistortion circuit of the invention receives a version of a digital symbol selected from a predefined constellation used for mapping a bit stream. In case the predistortion circuit is the first stage of a successive interference cancellation stage, the digital symbol itself is applied to the circuit input. A predistortion circuit of a further stage receives an adapted version of the digital symbol itself, as the latter has been corrected by adding a correction term at one or more preceding stages. It is remembered that the digital symbol is a symbol selected from a predefined constellation used by both transmitter and receiver when performing mapping and demapping, respectively. The predistortion circuit comprises one or more correction stages provided with a correction path arranged for determining a correction term. In that way the received version of the digital symbol gets updated stage-by-stage by adding a correction term. The predistortion circuit is characterised in that the correction term is a function of a transmission link model output and a corresponding symbol of a target constellation wherein the position of the constellation points is determined using a measure accounting for said transmission link. In a preferred embodiment the function is indicative of the difference between the output of the model equivalent to the transmission link and the corresponding symbol of the target constellation. This function can for instance be a multiplication of a scaling factor with the difference of the transmit link model output and a corresponding symbol of a target constellation. In the prior art solutions a difference is taken into account obtained by comparing a transmit link model output with a symbol belonging to the predefined constellation.

The predistortion circuit of the invention achieves a performance gain due to the fact that using said target constellation at the transmitter side, which is different from the predefined constellation, allows for a better match between the location of the received constellation symbols and the location of the predefined constellation symbols at the receiver side.

In an advantageous implementation this function also performs a phase correction whereby the phase rotation, caused by the magnitude change of the corrected digital symbols, is compensated for.

In a preferred embodiment said measure accounting for said transmission link is derived from a group of digital symbols output by the model equivalent to the transmission link. In an advantageous embodiment the measure accounting for said transmission link is derived from the mean of digital symbols of said group. The applied measure can take various forms. In a preferred embodiment the measure is indicative of the difference between the predefined constellation and the mean of digital symbols of said group. More specifically, the measure can be equal to this difference. In alternative embodiments a geometric mean of the magnitude of the digital symbols of said group or a generalized mean with a given exponent is used instead.

In an advantageous embodiment constellation symmetries are considered for determining said measure.

In an advantageous embodiment the correction term is further adapted for limiting in magnitude of the result of adding the correction term and said received version of said digital symbol. The different versions of the digital symbols at the output of one or more correction stages are so limited in magnitude.

In a preferred embodiment the model equivalent to the transmission link takes into account one or more of the following items: an upsampler, a transmit root Nyquist filter, a modulator, a non-linear amplifier, a demodulator, a receive root Nyquist filter, a down-sampler.

In another embodiment the model equivalent to the transmission link includes a linearization of a non-linear amplifier and/or one or more ideally linearized amplifiers.

In another aspect the invention relates to a predistortion structure comprising a plurality of predistortion stages each comprising a predistortion circuit as previously described.

In a preferred embodiment at least one of the predistortion stages is arranged for updating the target constellation. Advantageously, the updating comprises a comparison of said measure with the predefined constellation.

Preferably in the updating a multiplication with a further scaling factor is applied for convergence speed improvement. The scaling factor may have a dedicated value for each correction stage.

In a further aspect the invention also relates to a method for predistorting a digital signal in order to counter interference affecting the digital signal during transmission over a transmission link comprising a path of said digital signal between a mapper at a transmitter side and a demapper at a receiver side. The method comprising the steps of receiving a version of a digital symbol selected from a predefined constellation used for mapping a bit stream, determining in at least one correction stage a correction term indicative of the difference between the output of a model equivalent to the transmission link and a corresponding symbol of a target constellation wherein the position of the target constellation points is determined using a measure accounting for the transmission link, adding the correction term to the received version of the digital symbol and for outputting the result of the adding as an updated version of the digital symbol.

Preferably after one or more of the correction stages an update of the target constellation is determined.

In an embodiment one or more of the method steps are performed in an off-line mode before actually transmitting over said transmission link.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
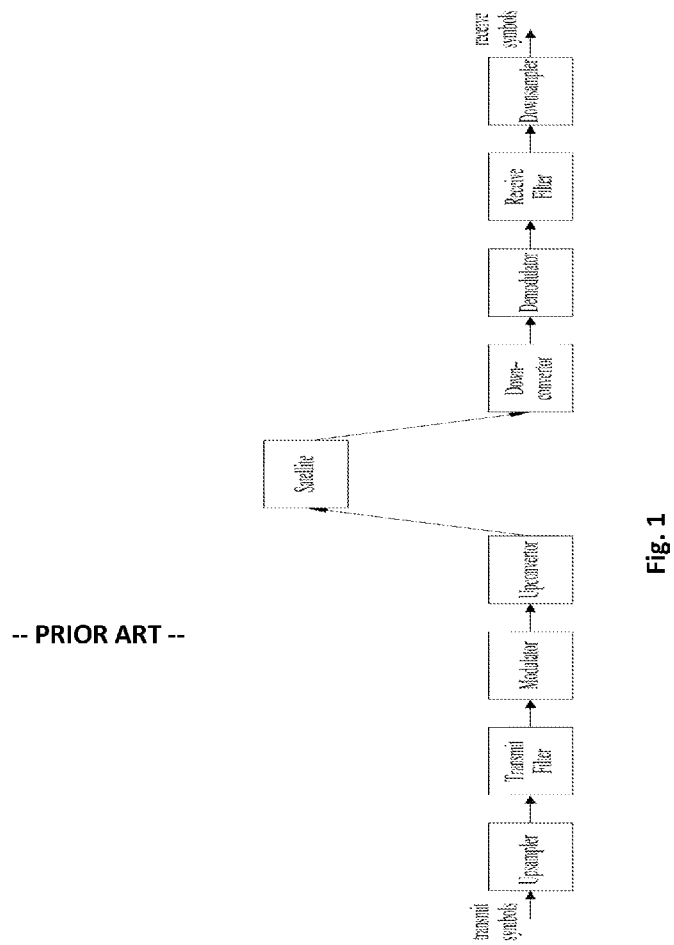
FIG. 1 illustrates an example of a satellite communication link.
Figure 2:
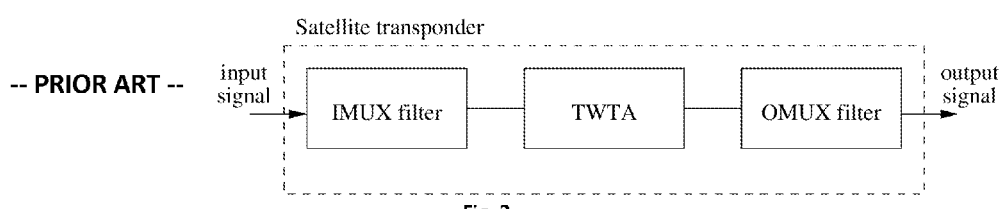
FIG. 2 illustrates a typical structure of a satellite transponder.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 3:
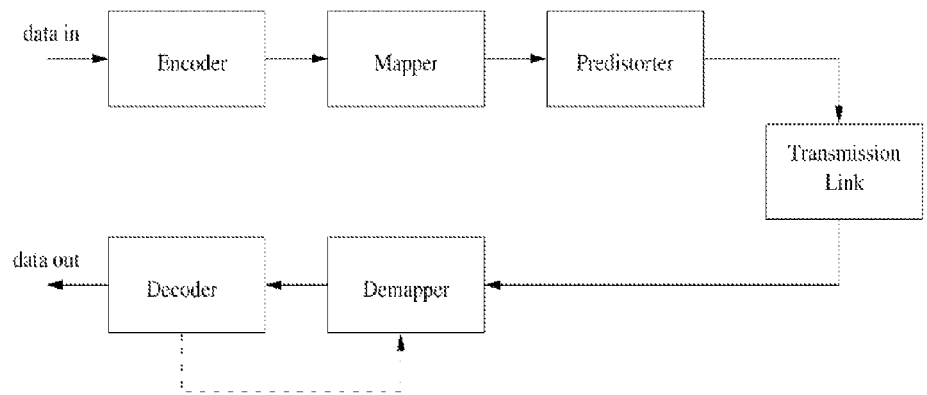
FIG. 3 represents a block scheme of a communication system with predistortion.

FIG. 3 shows an example communication system where incoming digital data is encoded with a forward error correcting code. This encoder can be a single encoder, but can also be the concatenation of several encoders. The encoder output is a stream of coded bits which are mapped to symbols belonging to a certain constellation such as PSK, APSK or QAM. This constellation is called the predefined constellation, as this is the constellation agreed upon by transmitter and receiver. These constellation symbols are then applied to a predistorter. The predistorted symbols are sent over a transmission link, which typically distorts the symbols and adds noise. At the receiver side the symbols are demapped using the predefined constellation as a reference. In an advantageous embodiment a different constellation can be used as a reference for demapping purposes, e.g. the constellation consisting of the mass points of the received symbols. The demapper outputs likelihood ratios of the coded bits, which are next fed to the decoder. Like the encoder, the decoder can be composed of one or more concatenated decoders. A person skilled in the art of digital receivers will readily understand that one or more decoders can process the received information in an iterative manner and one or more decoders can also exchange information with the demapper in an iterative fashion, as illustrated by the dashed arrow in FIG. 3.

Figure 4:
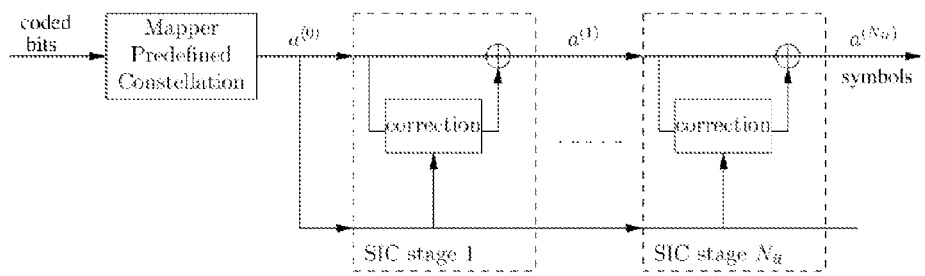
FIG. 4 illustrates a scheme of a prior art predistortion technique.
Figure 5:
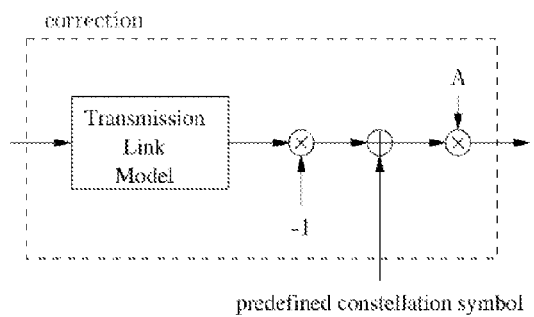
FIG. 5 illustrates in detail the correction block occurring in FIG. 4.

The structure with bit-to-symbol mapper and predistorter is now elaborated in detail. First, a prior art predistortion solution is shown in FIG. 4. The structure contains several identical stages, whereby each stage applies a correction on the transmitted symbols. Each stage is called a successive interference cancellation (SIC) stage. Each stage comprises a correction path containing a model of the transmission link, which mimics the effect of the full transmission link on a transmitted digital symbol. The correction term applied in a SIC stage is based on some function of the symbol value at the transmission link model output and the corresponding symbol of the predefined constellation. Advantageously said function is the difference between the symbol value at the transmission link model output and the corresponding symbol of the predefined constellation. FIG. 5 shows how the correction term is calculated in this prior art solution.

As opposed to this conventional solutions, the predistorter according to the present invention aims to reduce the received symbol distortion with respect to a target constellation that is essentially different from the predefined constellation used as reference constellation in the transmitter (mapper) and the receiver (demapper). This target constellation is derived in an iterative manner such that the location of the received constellation symbols, calculated via a model of the transmission link, matches as good as possible with the location of the predefined constellation symbols. As will be detailed below, such an approach allows for a substantial gain in performance.

Figure 6:
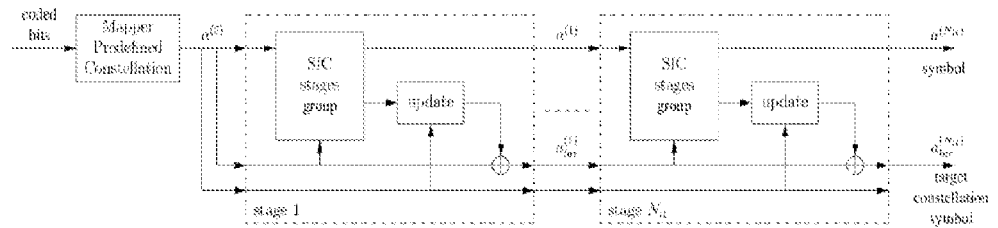
FIG. 6 represents a schematic diagram of the predistorter according to an embodiment of this invention.
Figure 7:
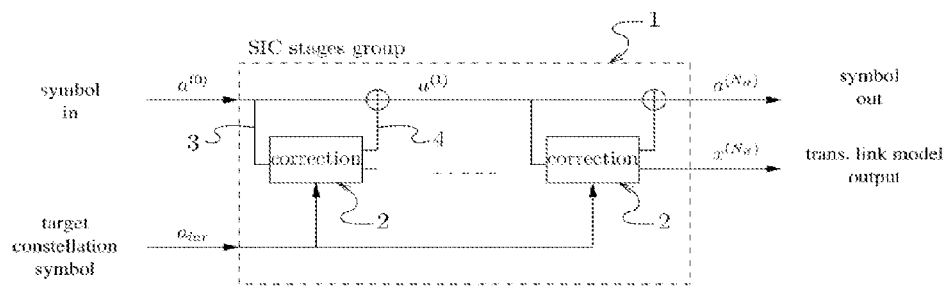
FIG. 7 illustrates the operation of a SIC stages group from FIG. 6.
Figure 8:
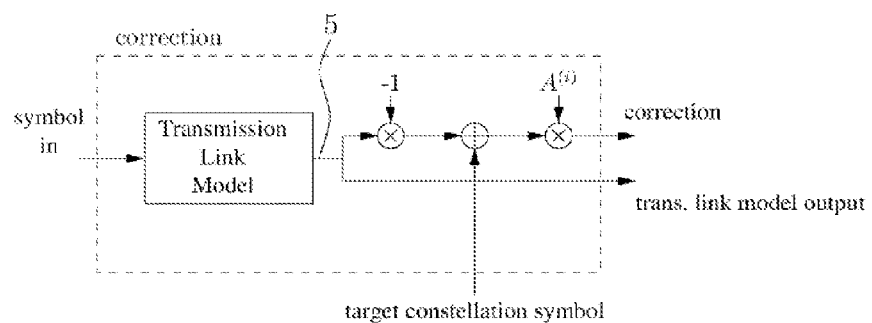
FIG. 8 represents the operation of the correction function of FIG. 7.

A block diagram of an embodiment of the present invention is shown in FIG. 6. The predistorter comprises several groups of SIC stages, each group comprising one or more SIC stages. A single group of SIC stages is shown in FIG. 7. The correction block is shown in FIG. 8. The correction term for SIC stage n of group m can be written as symbol correction[$n$]=$f_A^n$((target constellation symbol [$m$]), (model output[$n$]))

where $f_A^n$ is a function that depends on the iteration number n. In a low-complexity implementation of this function, the correction term can be written as symbol correction[$n$]=((target constellation symbol [$m$])-(model output[$n$])) *$A[n]$ Note that a SIC stage is indexed with n, whereas a group of SIC stages is indexed with m. The variable A[n] is a scaling factor that can be tuned to optimize the convergence speed. Within each SIC stage n, the transmitted symbols are updated as follows symbol[$n$+1]=symbol[$n$]+(symbol correction[$n$])

Figure 9:
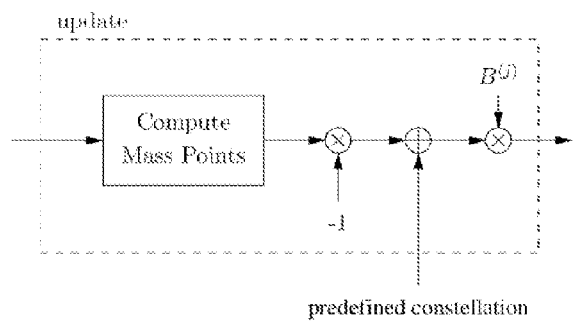
FIG. 9 illustrates the operation of the update function of FIG. 6.

As shown in FIG. 6, the target constellation used in the SIC stages is updated between the groups of SIC stages. The target constellation can be updated according to the method shown in the diagram from FIG. 9. The symbols at the transmission link model output are grouped according to the transmitted constellation symbol they correspond to. For each group a mass point is calculated. For reasons of implementation efficiency, different types of mass points can be considered. In one example implementation the mass point is calculated as the mean of the group of symbols. In another implementation the square-root of the averaged squared magnitudes of the symbols in the group is used. In another implementation it might be beneficial to use the geometric mean of the magnitudes or a generalized mean with a certain exponent, e.g. $(\text{mean}(X^P))^{1/p}$. It is also possible to exploit symmetries in the constellation (if the constellation exhibits symmetry) to compute the mass points. For example, the received symbols can be mapped onto a single quadrant of the complex plane (e.g. where I≥0 and Q≥0), using coordinate rotations and reflections. This allows achieving a more accurate averaging operation. The mass points of each of these groups of constellation points are then subtracted from the predefined constellation points. The difference is an error correction term, which is added to the target constellation (see FIGS. 6 and 8).

target constellation correction[$m$] =
((predefined constellation) − (model output mass points[$m$])) * $B[m]$ target constellation[$m$ + 1] =
target constellation[$m$] + target constellation correction[$m$]

The variable B[m] applied in the update is a scaling factor, which can be different for each SIC group m and which may be tuneable to optimize the convergence speed.

Figure 10:
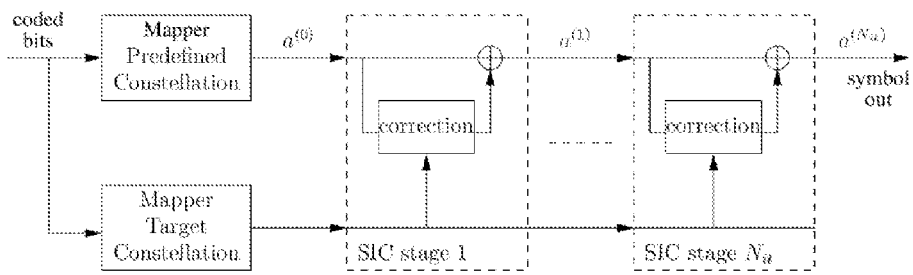
FIG. 10 represents a schematic diagram of the predistorter according to the second embodiment of this invention.

In another preferred embodiment the target constellation is fixed for all the SIC stages. This embodiment is illustrated in FIG. 10. For a certain combination of a predefined constellation and a transmission link model, the target constellation can be calculated and stored beforehand. The calculation of the target constellation is carried out as follows. Consider the structure depicted in FIG. 6, where one or more SIC stages groups are used, each containing at least one SIC stage. For the predefined constellation and transmission link model at hand, a specific or arbitrary sequence of coded bits is applied and the target constellation is calculated in an iterative manner just as described previously. The resulting target constellation is stored for each combination of predefined constellation and transmission link models of interest. It is thereafter used in FIG. 10, as the single fixed constellation within all SIC stages. The operation of the method is identical to the operation described in the previous paragraph, with the exception that the target constellation is not computed in a successive manner, but configured to the one that has been computed beforehand for the predefined constellation and transmission link model at hand.

In a preferred embodiment a modulated signal is predistorted, whereby a transmission link model is used that adequately models the actual transmission link.

Figure 13:
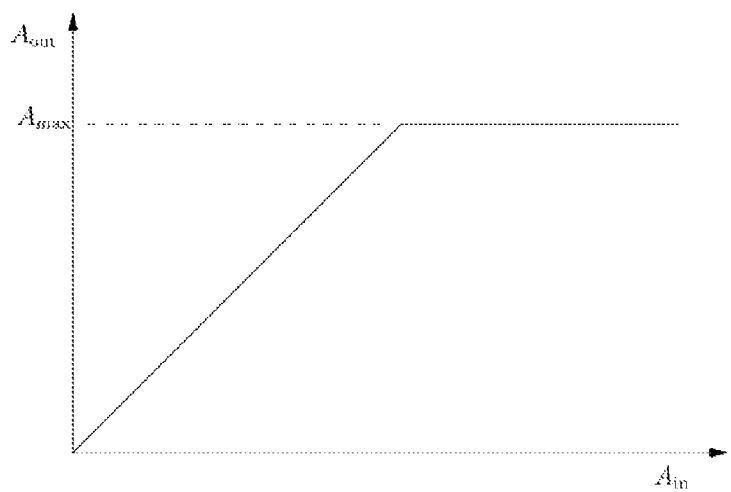
FIG. 13 illustrates the relation between input magnitude and output magnitude of an ideally linearized amplifier.

In another advantageous embodiment a modulated signal is predistorted, whereby a transmission link model is used that comprises a root Nyquist transmit filter, an ideally linearized TWTA and a root Nyquist receive filter. The relation between input and output power of an ideally linearized TWTA or amplifier is shown in FIG. 13. Depending on the actual transmission link characteristics, this embodiment can be computationally more efficient. Moreover, this embodiment is also useful when the actual transmission link is adapted to linearize one or more amplifiers in the transmission link. An amplifier preceded by a linearization technique or circuit can be modelled by an ideally linearized amplifier as described above.

By applying the aforementioned predistortion approach for modulating a signal prior to its transmission one can optimize predefined constellations for a communication system, resulting in specific, optimal predefined constellations.

It is pointed out that the predefined constellation together with the transmission link model unambiguously determines the target constellation when applying one of the embodiments of the invention previously described. Therefore, it suffices to describe the predefined constellation, whereas it is understood that a target constellation can be derived using an embodiment from this invention for any transmission link model.

Below a new 64APSK constellation is presented that has been optimized for a specific non-linear channel in combination with the predistortion method.

The table below defines the structure of the disclosed 64APSK constellation. The 64APSK constellation allows mapping a group of 6 bits (called label) to a constellation consisting of 64 points. The constellation points of the 64APSK constellation are situated on four concentric rings.

| Label | Radius | $\alpha/\pi$ $p = q = 0$ | $\alpha/\pi$ $p = \bar{q} = 0$ | $\alpha/\pi$ $\bar{p} = q = 0$ | $\alpha/\pi$ $\bar{p} = \bar{q} = 0$ |
|---|---|---|---|---|---|
| 0000pq | $R_4$ | 1/4 | 7/4 | 3/4 | 5/4 |
| 0001pq | $R_4$ | 13/28 | 43/28 | 15/28 | 41/28 |
| 0010pq | $R_4$ | 1/28 | 55/28 | 27/28 | 29/28 |
| 0011pq | $R_4$ | 1/4 | 7/4 | 3/4 | 5/4 |
| 0100pq | $R_4$ | 9/28 | 47/28 | 19/28 | 37/28 |
| 0101pq | $R_4$ | 11/28 | 45/28 | 17/28 | 39/28 |
| 0110pq | $R_3$ | 1/20 | 39/20 | 19/20 | 21/20 |
| 0111pq | $R_2$ | 1/12 | 23/12 | 11/12 | 13/12 |
| 1000pq | $R_4$ | 5/28 | 51/28 | 23/28 | 33/28 |
| 1001pq | $R_3$ | 9/20 | 31/20 | 11/20 | 29/20 |
| 1010pq | $R_4$ | 3/28 | 53/28 | 25/28 | 31/28 |
| 1011pq | $R_2$ | 5/12 | 19/12 | 7/12 | 17/12 |
| 1100pq | $R_3$ | 1/4 | 7/4 | 3/4 | 5/4 |
| 1101pq | $R_3$ | 7/20 | 33/20 | 13/20 | 37/20 |
| 1110pq | $R_3$ | 3/20 | 37/20 | 17/20 | 23/20 |
| 1111pq | $R_2$ | 1/4 | 7/4 | 3/4 | 5/4 |

Each point in the constellation is defined by:
- a bit label: this is the group of bits that will be mapped to this particular symbol. The labels are defined by means of two binary variables p and q. These variables can take on the values 0 and 1. In the notation used, $\bar{p}$=0 should be interpreted as p not equal to 0, or equivalently, p equal to 1.
- the angle: the angle (denoted by $\alpha$) of the each of the constellation points is substantially equal to the angles listed in the table above, whereby the angle is defined with respect to the I-axis and expressed in radials. As example, in this notation, a point with Q=0 and I>0 has an angle equal to 0 radials.
- the radius: the radius or amplitude of the point can take on several values, which are parameterized by the positive real parameter $R_i$. Points indicated with the same parameter $R_i$ have a substantially equal radius or amplitude.

According to this definition, the I and Q values of each point are given by the following formulas:

$$I = R_i \cos \alpha$$

$$Q = R_i \sin \alpha$$

Someone skilled in the art of digital communications will understand that this constellation is essentially equivalent to a large amount of other constellations. As an example, any permutation of a certain amount of bits, when applied to all the bit labels of the constellation, will result in an essentially equivalent constellation. Also, any constellation, whereby the values of certain bits of the label are flipped (i.e. 1 becomes 0 and 0 becomes 1), for all points of the constellation, are essentially equivalent. Also, applying a certain rotation to all points of the constellation, or applying a certain scaling factor to the amplitude of all constellation points, results in an essentially equivalent constellation. It is understood that many more methods exist to transform a given constellation into an essentially equivalent constellation.

The constellation disclosed above and all its equivalent versions have been optimized for use on a specific non-linear channel. The channel that was used for the optimization is a hard limiter amplifier, the characteristic of which is shown in FIG. 13. In the context of satellite communication, this can be interpreted as an ideally linearized TWTA characteristic, whereby the IMUX and OMUX filter of the satellite (FIG. 1) are omitted. The rationale behind the channel selection is that a predistorter, for example the one disclosed in this invention, aims to compensate for any distortion typically present in the transmission link, but it cannot overcome the maximum power limitation imposed by the amplifier. The simplified transmission link model allows for a simpler and computationally less demanding optimization of the constellation.

The ring radii of the constellation $R_1$, $R_2$, $R_3$ and $R_4$ can be optimized to yield the best performance on the non-linear channel described above. In some communication systems the satellite amplifier may be required to operate closer to the linear region, for example when regulatory limitations prevent using the full available power. In this case other parameter sets are optimal. The constellation ring radii can also be optimized per target code rate or information rate, which is defined as the ratio of the number of information bits used to generate a code word to the total number of coded bits in the code word. This ratio is also called FEC rate in the table below.

One option is to use the constellation for modulating a signal in combination with the predistortion method of this invention, whereby a transmission link model is used that adequately models the actual transmission link.

The constellation may also be used for modulating a signal in combination with the predistortion method proposed in the invention, whereby a transmission link model is used that comprises a root Nyquist transmit filter, an ideally linearized TWTA (FIG. 13) and a root Nyquist receive filter.

The predefined constellation can also be used for modulating a transmitted signal in the absence of predistortion or using a predistortion technique or linearization technique that is different from the one disclosed in the present invention.

The predistortion technique can also be used in combination with prior art constellations, e.g. the constellations defined in the DVB-S2 standard (ETSI EN 302 307: Second generation framing structure, channel coding and modulation systems for Broadcasting, Interactive Services, News Gathering and other broadband satellite applications). Someone skilled in the art will understand that the ring radii of prior art constellations can be optimized for operation on a non-linear channel, in combination with the predistortion technique disclosed in the present invention.

Figure 11A:
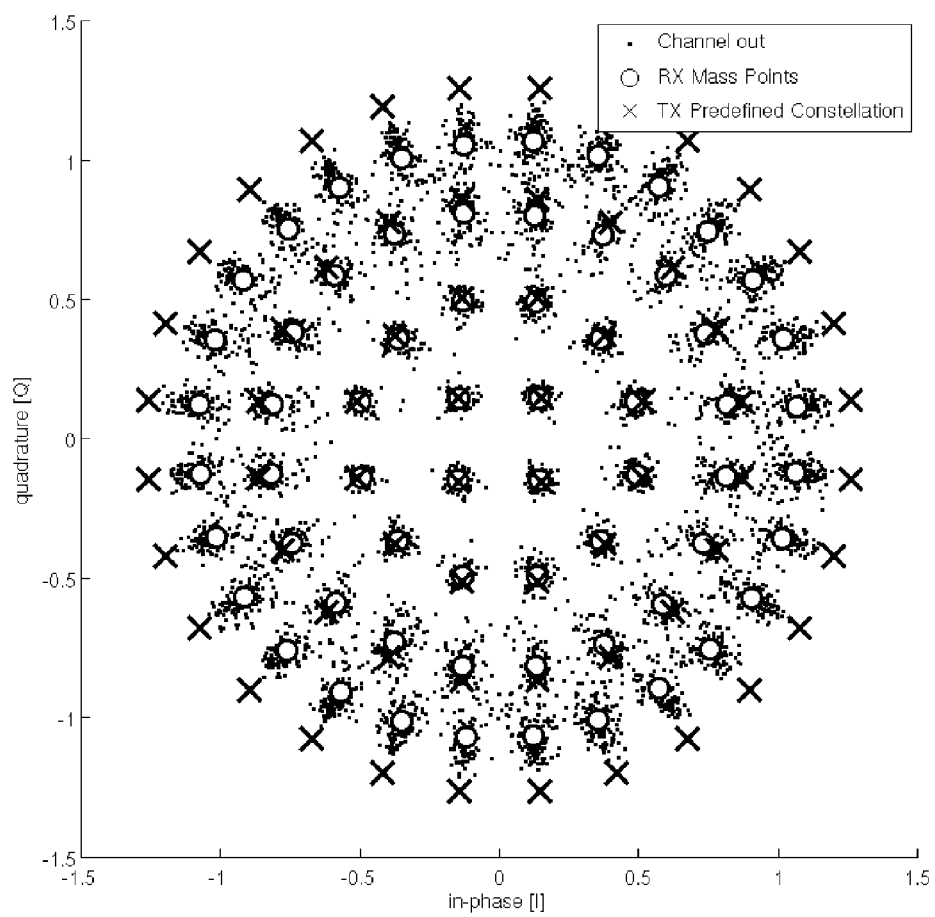
FIG. 11a, 11b, 11c illustrate the transmission link output of a modulated 64APSK signal, without predistortion, using a prior art predistortion technique and using the predistortion technique disclosed in the present invention.
Figure 11B:
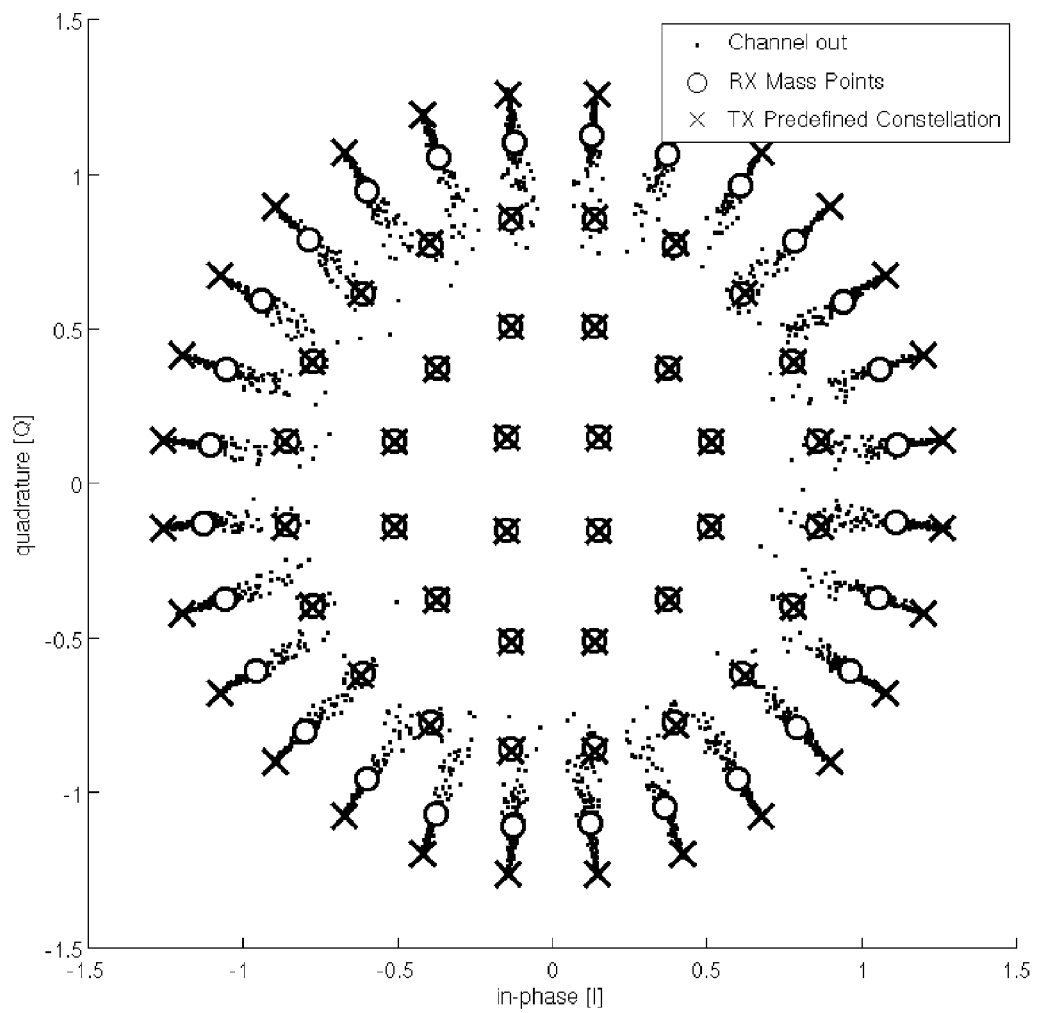
Figure 11C:
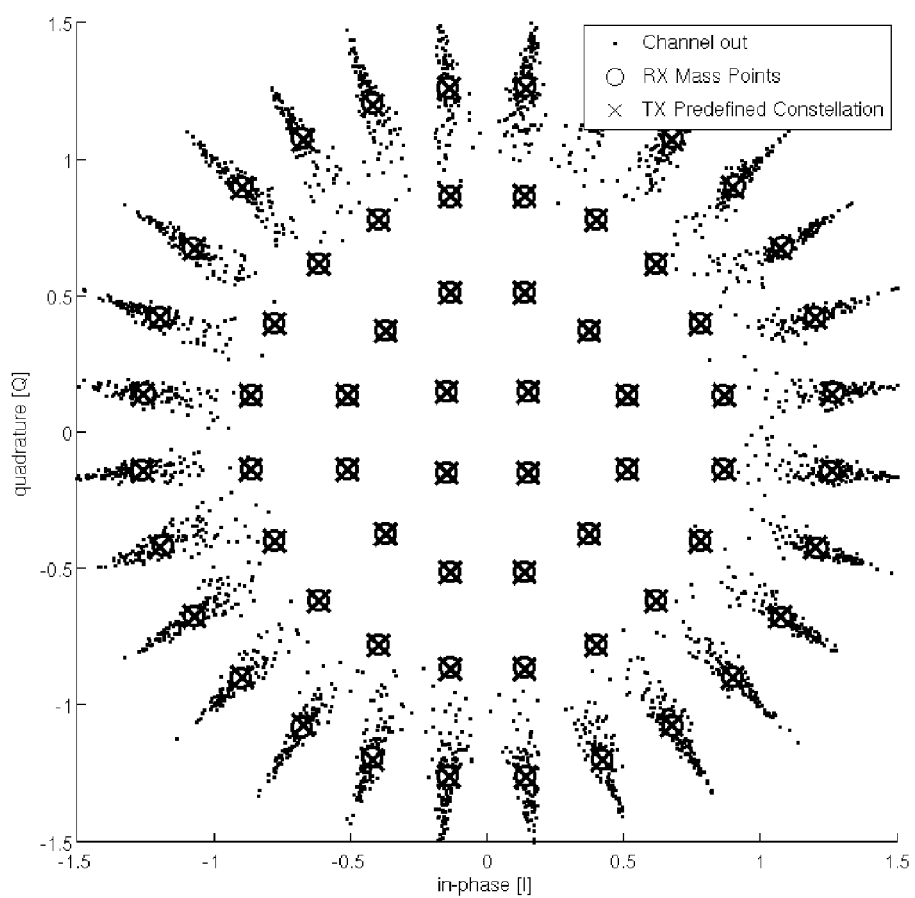

FIG. 11c illustrates the operation of the predistortion technique. It shows a diagram of received constellation points, when using the predistortion technique disclosed in this invention. One can see that the mass points of the received constellation coincide with the predefined constellation points. This will ensure a good demapping and decoding of the received signal. One can also observe in FIG. 11b that, when using a prior art predistortion technique, the mass points of the received constellation diagram differ from the predefined constellation points. A similar observation can be made in case no predistortion is applied (FIG. 11a). Note that in the latter scenario, the ISI is also significantly larger.

As an example illustrating the applicability of the invention, performance evaluations have been carried out. A low-density parity-check (LDPC) code similar to the one defined in the DVB-S2 standard is used to encode the data bits prior to the symbol mapping and modulation (as shown in FIG. 3). The FEC rate of the code is 4/5. A state-of-art receiver including a demapper and decoder is used to evaluate the frame error rate (FER) performance of the new constellations.

Figure 12:
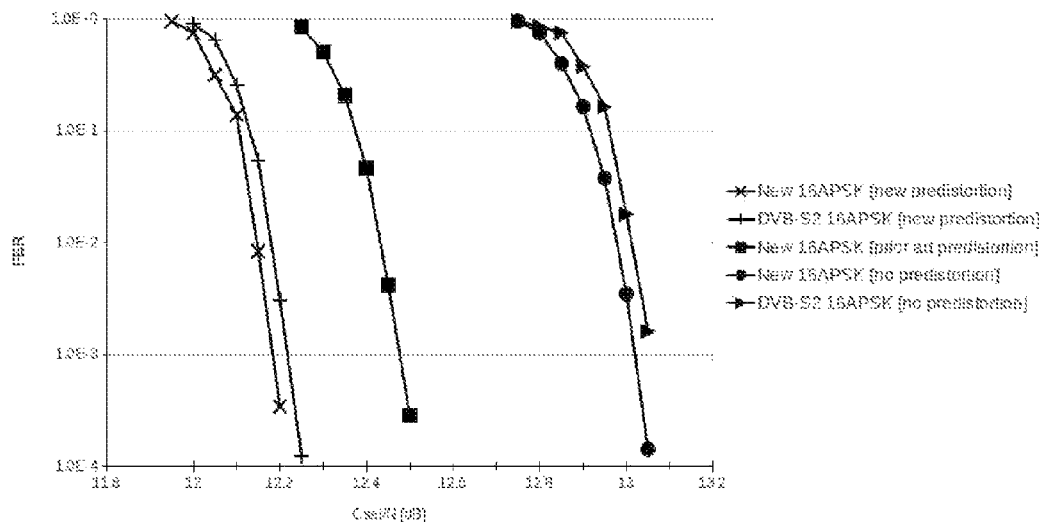
FIG. 12 shows frame error rates of the different predistortion techniques.

FIG. 12 compares the performance of a 16APSK constellation with optimized ring radii to the performance of the 16APSK constellation that has been defined in the DVB-S2 standard. The performance was evaluated on a non-linear channel with the predistortion technique according to the invention. The DVB-S2 constellation is also defined in patent U.S. Pat. No. 7,123,663. FIG. 12 illustrates that the optimized constellation has a lower frame error rate compared to the prior art constellations, for the same amplifier saturated power to noise power ratio.

FIG. 12 also compares the performance of the new constellation with the constellations defined in the DVB-S2 standard for a non-linear channel in the absence of the predistortion technique. It can be observed that the newly optimized constellation also outperforms the existing DVB-S2 constellations in the absence of predistortion.

Finally, FIG. 12 also illustrates the performance gain that is offered by the new predistortion method. The predistortion technique allows achieving the same FER level at a significantly lower signal-to-noise level, compared to the case without predistortion or the case using a prior art predistortion technique.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A predistortion circuit for countering interference affecting a digital signal during transmission over a transmission link between a mapper at a transmitter side and a demapper at a receiver side, wherein the predistortion circuit is arranged for receiving a digital symbol selected from a predefined constellation used for mapping a bit stream, and comprises at least one correction stage arranged for:
   determining an output value of a transmission link model receiving an input symbol, which is the selected digital symbol for a first correction stage and an output of a previous correction stage for any following correction stage;
   determining a correction term as a function of said output value and a target constellation symbol;
   wherein the predistortion circuit further comprises an adder after each correction stage arranged for adding said correction term to said digital symbol received by that correction stage and for outputting to a following correction stage or to an output of the predistortion circuit in case the correction stage is a last one, a result of said adding as an updated version of said digital symbol, and wherein said target constellation symbol is a symbol of the target constellation corresponding to said digital symbol, said target constellation being derived from said predefined constellation and said transmission link model and having a position of the target constellation points determined by calculating a mass point for groups of output values of said transmission link model, each output value of a same group corresponding to a same digital symbol of said predefined constellation.

2. The predistortion circuit as in claim 1, wherein said mass point is derived from a mean of said output values.

3. The predistortion circuit as in claim 2, wherein said mean of said output values is replaced by a geometric mean of said output values of said group or by a generalized mean with a given exponent.

4. The predistortion circuit as in claim 1, wherein constellation symmetries are considered for determining said mass point.

5. The predistortion circuit as in claim 1, wherein said function is indicative of a difference between the output value of said transmission link model and said corresponding symbol of said target constellation.

6. The predistortion circuit as in claim 5, wherein said function comprises a multiplication of said difference with a scaling factor.

7. The predistortion circuit as in claim 1, wherein said function is adapted for performing a phase correction to compensate for a phase rotation.

8. The predistortion circuit as in claim 1, wherein said correction term is adapted for limiting a magnitude of said result of adding said correction term and said received digital symbol.

9. The predistortion circuit as in claim 1, wherein said transmission link model takes into account one or more of the following items: an upsampler, a transmit root Nyquist filter, a modulator, a non-linear amplifier, a demodulator, a receive root Nyquist filter, a down-sampler.

10. The predistortion circuit as in claim 1, wherein said transmission link model includes a linearization of a non-linear amplifier and/or one or more ideally linearized amplifiers.

11. The predistortion structure comprising a plurality of predistortion stages each comprising a predistortion circuit as in claim 1.

12. The predistortion structure as in claim 11, wherein at least one of said predistortion stages is arranged for updating said target constellation.

13. The predistortion structure as in claim 12, wherein said updating comprises a comparison of said measure with said predefined constellation.

14. The predistortion structure as in claim 12, whereby in said updating a multiplication with a further scaling factor is applied for convergence speed improvement.

15. A method for predistorting a digital signal in order to counter interference affecting said digital signal during transmission over a transmission link between a mapper at a transmitter side and a demapper at a receiver side, the method comprising the steps of:
   receiving a digital symbol selected from a predefined constellation used for mapping a bit stream;
   determining in at least one correction stage an output value of a transmission link model receiving an input symbol, which is the selected digital symbol for a first correction stage and an output of a previous correction stage for any following correction stage;
   determining a correction term as a function of said output value a target constellation symbol;
   adding after each correction stage said correction term to said digital symbol received by that correction stage and for outputting to a following correction stage or to an output of the predistortion circuit in case the correction stage is a last one, a result of said adding as an updated version of said digital symbol, wherein said target constellation symbol is a symbol of the target constellation corresponding to said digital symbol, said target constellation being derived from said predefined constellation and said transmission link model and having a position of the target constellation points determined by calculating a mass point for groups of output values of said transmission link model, each output value of a same group corresponding to a same digital symbol of said predefined constellation.

16. The method for predistorting as in claim 15, wherein after one or more of said correction stages an update of said target constellation is determined.

17. The method for predistorting as in claim 15, wherein at least one of the method steps is performed in an off-line mode before actually transmitting over said transmission link.

* * * * *